United States Patent [19]

Richardson

[11] 4,235,648

[45] Nov. 25, 1980

[54] METHOD FOR IMMERSION PLATING VERY THIN FILMS OF ALUMINUM

[75] Inventor: Lavoie Richardson, Tempe, Ariz.

[73] Assignee: Motorola, Inc., Schaumburg, Ill.

[21] Appl. No.: 27,213

[22] Filed: Apr. 5, 1979

[51] Int. Cl.³ .............................................. C23C 3/00
[52] U.S. Cl. .................................. 148/6.27; 156/665; 156/667; 427/90; 427/309; 427/328; 427/436
[58] Field of Search ................. 156/665, 667; 427/88, 427/90, 328, 309, 436, 92; 148/6.27

[56] References Cited

U.S. PATENT DOCUMENTS

| | | | |
|---|---|---|---|
| 3,329,522 | 7/1967 | Salibestre et al. | 427/328 |
| 3,551,122 | 12/1970 | Gulla | 427/328 |
| 3,579,375 | 5/1971 | Wonilowicz | 427/92 |
| 3,594,197 | 7/1971 | Bunevich et al. | 427/436 |
| 3,669,734 | 6/1972 | Jacob et al. | 427/92 |
| 3,672,964 | 6/1972 | Bellis | 427/92 |
| 3,726,771 | 4/1973 | Coll-Palagoes | 427/328 |
| 3,982,055 | 9/1976 | Howard | 427/328 |
| 4,082,604 | 4/1978 | Yanez | 156/665 |
| 4,087,367 | 5/1978 | Rioult et al. | 156/667 |
| 4,125,648 | 11/1978 | Vratny | 427/328 |

OTHER PUBLICATIONS

Hildick, "Forming Low Metal-to-metal Contact Resistance in Multilevel Metallization" IBM TDB, vol. 19, No. 1, p. 20, 1971.

*Primary Examiner*—John D. Smith
*Attorney, Agent, or Firm*—Paul F. Wille

[57] ABSTRACT

A method for plating very thin films of aluminum for subsequent electrical contact. The method is particularly suitable for preparation of the thin films of aluminum used in semiconductor integrated circuits for subsequent plating operations or lead bonding processes. The method comprises a removal of surface oxides in a way that does not substantially attack the very thin films of aluminum followed by immersion plating with a metal selected from the group comprising zinc, tin, nickel, silver and copper.

2 Claims, No Drawings

METHOD FOR IMMERSION PLATING VERY THIN FILMS OF ALUMINUM

SUMMARY AND BACKGROUND OF THE INVENTION

Thin films of aluminum have become technologically very significant. For example, vacuum-deposited aluminum films in the range of 5000 Å to 2 microns in thickness are very commonly employed in semiconductor devices. This is because the aluminum is readily deposited, easily etched in fine configurations, has high electrical conductivity and is relatively inexpensive. Most complex integrated circuits use either aluminum or a substantially-aluminum alloy as the primary metallization. Because the aluminum is deposited and etched into a number of fine lines to provide the desired wiring configuration for the circuit, and because it is relatively soft, it is common to provide an overlying passivating and protecting insulating layer. Holes or vias are then formed in the insulating layer so that contact may be made to the underlying substantially-aluminum layer. This contact may be achieved by bonding fine wires—typically aluminum or gold—to the underlying aluminum, or in the alternative, by depositing either aluminum or a composite of other metals in order to form a bump structure which may be contacted directly by, for example, soldering. Aluminum itself is commonly used as a second layer where it is desired to have more than one level of wiring in the circuit wherein the crossover of the second level metal pattern over the pattern in the first layer aluminum metallization provide increased flexibility and complexity in the wiring topology.

A major problem associated with any of these applications is the tendency for aluminum films to rapidly form a suface layer of aluminum oxide when exposed to common oxidizing ambients such as air or moisture. This oxide layer in turn interferes greatly with the establishment of metallurgical bonds between the aluminum film and almost all other metals deposited or bonded to it. This is because most other metals are incapable of chemically reducing the aluminum oxide film to aluminum, thus enabling the establishment of metallurgical bonds. A few metals that are capable of reducing aluminum oxide are lithium, beryllium, magnesium and calcium, all of which have other problems associated with their use and hence have not been employed to overcome the aluminum oxide problem. Of course aluminum itself is incapable of reducing its own oxide so that evaporation of a second layer of aluminum over a first layer of aluminum with contacts in only limited areas usually results in a very high contact resistance between the two layers. One technique which has been used to solve this problem is the vacuum back-sputtering in the same chamber which is used for the deposition of subsequent metal or metals. This has the disadvantages that many devices are sensitive to the charge effects introduced by the back sputtering and the further drawback that expensive vacuum processing must be used as compared with the simpler plating techniques well established in the metallurgical art. Thus, where it is desired, for example, to build up a bump over a first layer of aluminum, it is common to back-sputter and vacuum deposit layer or layers of metals in order to serve as a plating base.

The aluminum oxide forms very rapidly in the presence of air or moisture and thus it has been found not feasible to use wet chemical techniques in order to remove the oxide prior to exposure of the aluminum to subsequent metal deposition processing steps. The elimination of the aluminum oxide layer between the aluminum film and other metal films placed on top of it would enable the formation of metallurgical bonds between the aluminum and the subsequent metals greatly enhancing the mechanical strength of the bonds and reducing the electrical resistance at the interface. It is the purpose of this invention to provide a process which eliminates the disadvantages aluminum oxide film in a way which simplifies the subsequent processing. A further object of this invention is to provide a technique for securing a protective metallic film on the surface of the aluminum without destroying the aluminum film. It is yet another object of this invention to describe compatible subsequent processing steps which exploit the protective film thus formed.

To eliminate the aluminum oxide film from thin aluminum films in order to enhance metallurgical bonding between the aluminum film and overlying metals, a two-step process is disclosed: (1) Chemical removal of the aluminum oxide and, (2) replacement of the outer layers of aluminum with a second metal which does not oxidize or which can readily be plated, or whose oxide is reduced by a solid state process by a third metal which is to be bonded to the aluminum film. Examples of metals whose oxides are easily reduced are silver, copper and nickel. Tin oxides and zinc oxides are readily reduced at elevated temperatures by aluminum so that either tin or aluminum are suitable for the intermediate bond between a lower aluminum film and an upper aluminum film. Tin and zinc processes have long been used on both aluminum and aluminum alloys in order to provide an electroplating base. Prior known processes for plating both aluminum with tin and zinc are too uncontrolled for plating thin films of aluminum as they invariably result in the partial or complete destruction of the thin aluminum films used in microelectronics. This is because aluminum is easily attacked by either acidic or basic solutions and the immersion plating process is a two-step procedure wherein the residual aluminum oxide must first be removed in a fairly strong acidic or basic solution and the plating of subsequent metal also involves a fairly strong acidic or basic solution.

In the present invention, the removal of the surface aluminum oxide is achieved by etching at a relatively weak buffered fluoride solution followed by an immediate dip into hot water. For best results, this etch-dip process is repeated prior to the metal immersion plating. The immersion solution contains the fluoride ion which has a very high solvent capability for the aluminum surface oxide which normally precludes adhesion of coatings on thin aluminum layers. The use of the hot water treatment prior to the immersion plating appears to result in an aluminum oxide which is more susceptible to replacement than oxides formed by other preplating treatments.

DETAILED DESCRIPTION OF THE PREFERRED EMBODIMENT

By way of a preferred embodiment, an example of the use of zincation of a lower or first metal layer on an aluminum microcircuit in order to provide adherent and electrically conductive contacts to an upper conductor layer deposited through vias in an insulating layer will be given. Starting with an integrated circuit substrate having the patterned first layer aluminum metallization and an overlying insulating film which is primarily a silicon oxide and having via holes etched therethrough for the formation of contacts to the underlying layer of aluminum, the substrate was dipped for one second to a 50° C. 4:1 solution of 40% $NH_4F$:49% HF followed immediately by dip into 50° C. water for one second. This two-fold sequence is repeated and the sample was then immersed into a zinc bath comprising 200 grams $ZnSO_4.7H_2O$, 10 milliliters HF and 1000 milliliters $H_2O$. With the bath at 50° C., the plating occurred in approximately 4 seconds. A second layer of aluminum was then deposited without backsputtering and patterned to provide a contact-resistance test pattern. The contact resistance between the two layers of aluminum was measured and found to be approximately 30% higher than with the standard back-sputtered surface preparation prior to the deposition of the aluminum. After sintering at about 500° C. for 20 minutes, the contact resistance was reduced to a value substantially equal with the conventional back-sputtered system.

A variety of other surface etching techniques prior to immersion plating were tried. Most of these resulted in partial or complete destruction of the thin underlayer of aluminum. It is believed that the relatively weak buffered HF solution in combination with the hot water dip produces minimal attack of the aluminum and provides a modified aluminum oxide which is particularly susceptible to subsequent plating. Both the preplating and/or the plating solutions may be further diluted with water in order to slow the processes. The exact details of the process are not understood and in fact are not obvious because it would appear that the hot water dip would tend to induce a surface film which would negate the effects of the acid oxide removal. The relatively weak HF solutions employed in both the preplating and the plating steps do not significantly affect the oxide insulating films used in conduction with the integrated circuits. Using the cited preparation technique, satisfactory immersion plating films of tin and nickel were also achieved.

In addition to the elimination of the back-sputter step, enabled by the process described, a visual indication of the efficacy and homogeneity of the process for producing reliable electrical connections is provided by the change in appearance of the aluminum which has been plated. That is, in etching the insulator over the first layer of aluminum, poor process control can result in incomplete removal of the interlayer insulating film so that some or all of the vias may not be open. Since the immersion plating will not be effective in areas covered by oxide, simple microscopic examination can readily detect the occurrence of poor process control during the insulator via etching step.

The process of removing $Al_2O_3$ surface films from aluminum films and replacing them wiht metals that are readily reduced by an overlying metal to promote true metallurgical bonds are useful for many applications that require improved mechanical bonds and improved electrical contact to aluminum films: (1) contacting first and second layer metal films through vias particularly for devices which are damaged by the back-sputtering process; (2) forming metal bumps on aluminum films in order to provide for the simultaneous attachment of a plurality of leads etched from a thin metal frame; (3) providing mechanically-adherent electrically conductive solder pads to aluminum films, e.g. copper and nickel layers; (4) eliminating of surface oxide prior to conventional thermal compression or ultrasonic wire bonding to aluminum bonding pads. Thus the inventive process contemplates various uses for the aluminum films as well as a number of plating materials.

What is claimed is:

1. A method for eliminating an aluminum oxide surface film on a substantially aluminum thin film layer comprising in order: immersing said layer in a fluoride-based solution; immersing said layer in water at about 50° C. to form a fresh surface aluminum oxide film; and immersing said layer in an immersion solution comprising the fluoride ion and a metal selected from the group consisting of zinc, tin, nickel, silver and copper.

2. The method of claim 1 wherein the steps of immersion in a fluoride-based solution and hot water are repeated prior to immersion in said solution.

* * * * *